United States Patent [19]
Takaishi

[11] Patent Number: 6,143,600
[45] Date of Patent: Nov. 7, 2000

[54] METHOD OF FABRICATING A SEMICONDUCTOR MEMORY DEVICE HAVING BIT LINE DIRECTLY HELD IN CONTACT THROUGH CONTACT WITH IMPURITY REGION IN SELF-ALIGNED MANNER

[75] Inventor: Yoshihiro Takaishi, Tokyo, Japan

[73] Assignee: NEC Corporation, Tokyo, Japan

[21] Appl. No.: 08/964,110

[22] Filed: Nov. 5, 1997

Related U.S. Application Data

[62] Division of application No. 08/634,385, Apr. 18, 1996, Pat. No. 5,973,343.

[30] Foreign Application Priority Data

Apr. 20, 1995 [JP] Japan ......................... 7-95299

[51] Int. Cl.⁷ ............................................. H01L 21/8242
[52] U.S. Cl. ............................................ 438/253; 438/396
[58] Field of Search ................................. 438/253, 256, 438/396, 399

[56] References Cited

U.S. PATENT DOCUMENTS

| | | |
|---|---|---|
| 5,158,905 | 10/1992 | Ahn . |
| 5,387,532 | 2/1995 | Hamamoto et al. . |
| 5,396,094 | 3/1995 | Matsuo . |
| 5,405,800 | 4/1995 | Ogawa et al. . |
| 5,459,341 | 10/1995 | Shono et al. . |
| 5,476,805 | 12/1995 | Woo et al. . |
| 5,486,712 | 1/1996 | Arima . |
| 5,693,553 | 12/1997 | Kashihara et al. . |

FOREIGN PATENT DOCUMENTS

| | | |
|---|---|---|
| 62-224068 | 10/1987 | Japan . |
| 63-281457 | 11/1988 | Japan . |
| 3-102869 | 4/1991 | Japan . |
| 4-12562 | 1/1992 | Japan . |
| 4-14869 | 1/1992 | Japan . |
| 4-97565 | 3/1992 | Japan . |
| 5-110018 | 4/1993 | Japan . |

*Primary Examiner*—Tuan H. Nguyen
*Attorney, Agent, or Firm*—Sughrue, Mion, Zinn, Macpeak & Seas, PLLC

[57] ABSTRACT

Two n-channel enhancement type switching transistors are fabricated on an active area in such a manner as to share a common drain region, and gate electrodes are encapsulated in insulating wall structures defining a contact hole over the common drain region so as to allow a bit line to be directly held in contact through the contact hole with the common drain region.

5 Claims, 13 Drawing Sheets

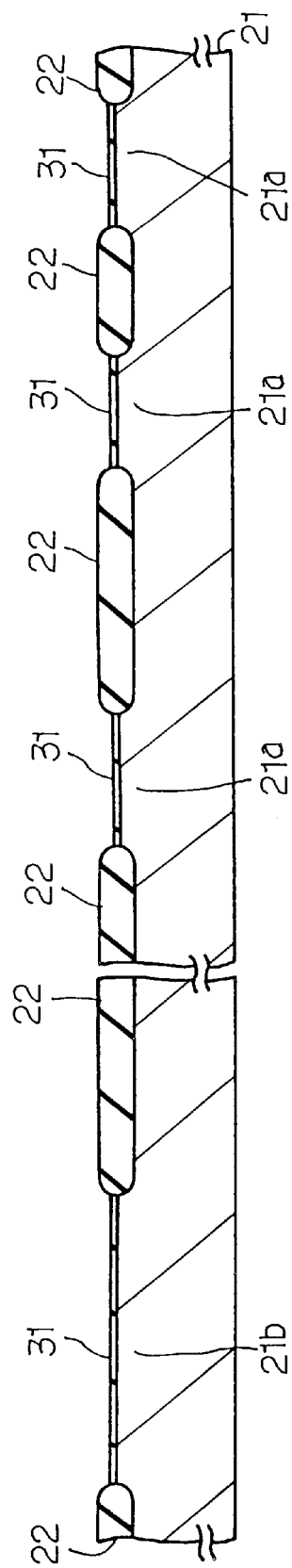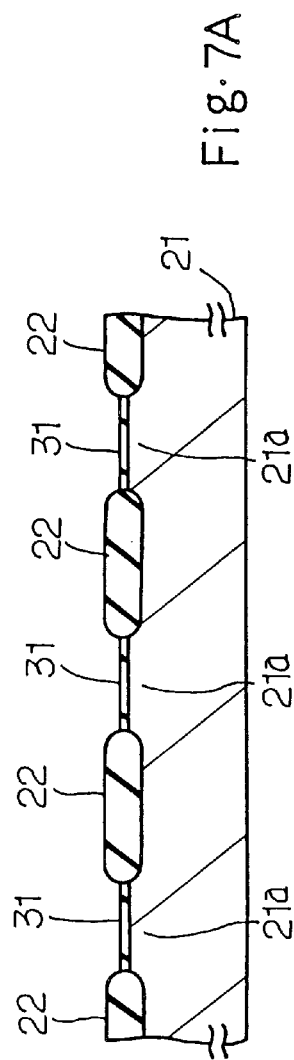

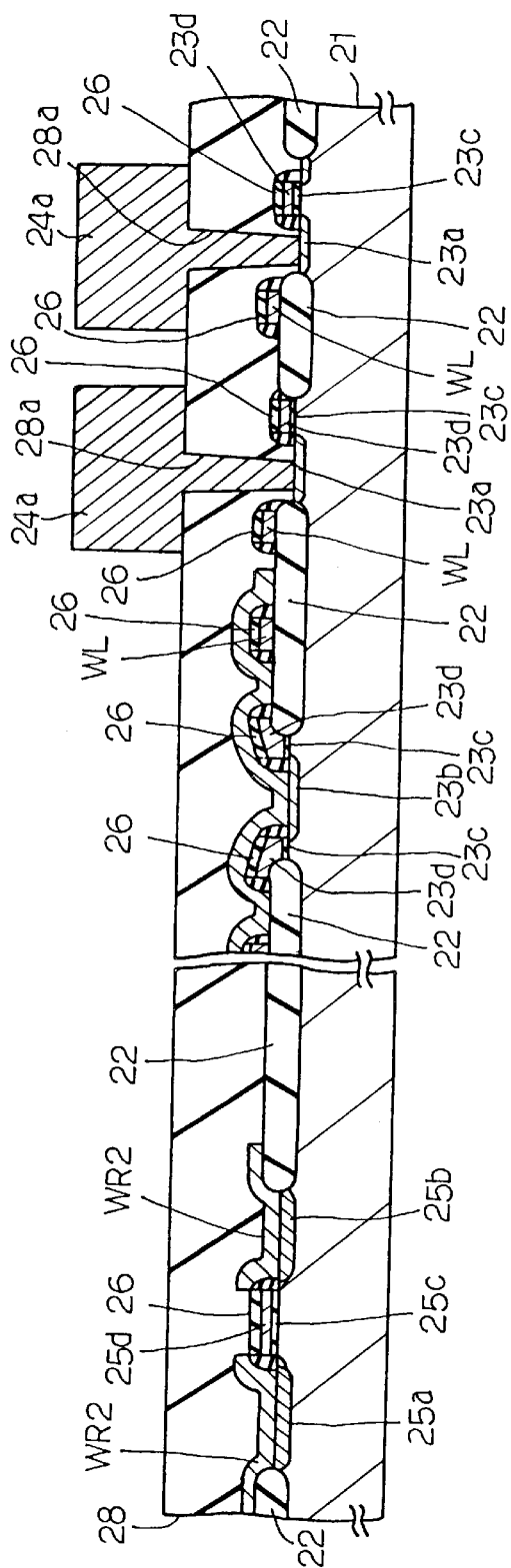
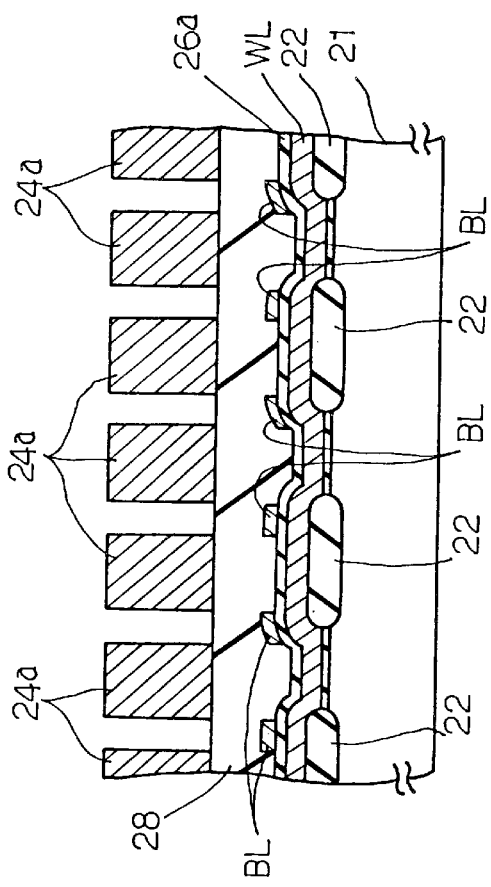

6,143,600

METHOD OF FABRICATING A SEMICONDUCTOR MEMORY DEVICE HAVING BIT LINE DIRECTLY HELD IN CONTACT THROUGH CONTACT WITH IMPURITY REGION IN SELF-ALIGNED MANNER

This is a divisional of Application Ser. No. 08/634,385 filed Apr. 18, 1996, now U.S. Pat. No. 5,973,343.

FIELD OF THE INVENTION

This invention relates to a semiconductor memory device and, more particularly, to a semiconductor memory device having a bit line directly held in contact through a small contact with an impurity region in a self-aligned manner and a process of fabrication thereof.

DESCRIPTION OF THE RELATED ART

A semiconductor ultra large-scale integration has a multiply laminated structure, and conductive patterns and insulating patterns are laminated on a semiconductor substrate. Conductive patterns on different levels are electrically connected through a conduct hole, and the contact hole is miniaturized together with the conductive patterns.

A dynamic random access memory device is a typical example of the semiconductor ultra large scale integration, and FIG. 1 illustrates the prior art dynamic random access memory cell.

The prior art dynamic random access memory cell is fabricated on a p-type silicon substrate 1, and a field oxide layer 2 is selectively grown on the p-type silicon substrate 1. The field oxide layer 2 defines an active area assigned to a pair of dynamic random access memory cells M1 and M2. The dynamic random access memory cells M1 and M2 are identical in structure with one another.

N-type source regions 3a/3b and an n-type common drain region 3c are formed in the active area at intervals, and gate oxide layers 4a and 4b are grown on the channel areas between the n-type source regions 3a and the n-type common drain region 3c. The gate oxide layers 4a and 4b are overlain by gate electrodes 5a and 5b, respectively, and the gate electrodes 5a and 5b form parts of word lines WL. The n-type source region 3a, the n-type common drain region 3c, the gate oxide layer 4a and the gate electrode 5a form in combination an n-channel enhancement type switching transistor SW1 and SW2.

The word lines WL are wrapped in. a first inter-level insulating layer 6a, and contact holes 6b and 6c are formed in the first inter-level insulating layer 6a so as to expose the n-type source regions 3a/3b and the n-type common drain region 3c. Storage node electrodes 7a and 7b are formed on the first inter-level insulating layer 6a, and held in contact through the contact holes 6b and 6c with the n-type source regions 3a and 3b, respectively.

The storage node electrodes 7a and 7b are covered with dielectric films 8a and 8b, respectively, and cell plate electrodes 9a and 9b are opposed through the dielectric films 8a/8b to the storage node electrodes 7a and 7b. The storage node electrodes 7a/7b, the dielectric films 8a/8b and the cell plate electrodes 9a/9b form in combination stacked storage capacitors CP1 and CP2, and the n-channel enhancement type switching transistors SW1 and SW2 and the stacked storage capacitors CP1 and CP2 as a whole constitute the dynamic random access memory cells M1 ad M2.

The dynamic random access memory cells M1 and M2 are covered with a second inter-level insulating layer 10a, and a contact hole 10b is formed in the second inter-level insulating layer 10a. The n-type common drain region 3c is exposed to the contact hole 10b. A bit line BL extends over the second inter-level insulating layer 10a, and is held in contact through the contact hole 10b with the n-type common drain region 3c.

The word lines WL are selectively changed to an active high level, and the n-channel enhancement type switching transistors SW1 and SW2 selectively turn on so as to conduct the associated stacked storage capacitors CP1 and CP2 to the bit line BL.

The contact hole 10b is formed through a photolithographic process, and a nesting tolerance is necessary between the n-type common drain region 3c and the contact hole 10b. If the nesting tolerance is too small, the contact hole 10b may pass through the first inter-level insulating layer 6a so as to expose the gate electrode 5a or 5b thereto. However, the large nesting tolerance consumes a substantial amount of the active area, and impedes the scale-down of the dynamic random access- memory cell M1/M2.

In order to decrease the nesting tolerance, Japanese Patent Publication of Unexamined Application No. 63-281457 discloses a structure of dynamic random access memory cell, and FIG. 2 illustrates the structure of the second dynamic random access memory cell.

A pair of dynamic random access memory cells M3 and M4 is fabricated on an active area defined by a thick field oxide layer 11 selectively grown on a p-type silicon substrate 12. The dynamic random access memory cells M3 and M4 are similar in structure to the dynamic random access memory cells M1 and M2, and the layers and the regions forming parts of the memory cells M3 and M4 are labeled with the same references as those of the memory cells M1 and M2 without detailed description.

A contact hole 6d is formed in the first inter-level insulating layer 6a, and the n-type common drain region 3c is exposed to the contact hole 6d. A conductive pad 13 is formed on the first inter-level insulating layer 6a, and is held in contact through the contact hole 6d with the n-type common drain region 3c. The top surface of the conductive pad 13 is smoothened, and partially overlapped with the gate electrodes 5a and 5b. The conductive pad 13 is covered with the second inter-level insulating layer 10a, and the bit line BL is held in contact through the contact hole 10b with the top surface of the conductive pad 13.

The prior art structure shown in FIG. 2 is fabricated as follows. The thick field oxide layer 11 is selectively grown on the p-type silicon substrate 12, and the gate oxide layers 4a and 4b are thermally grown on the active area. The word lines WL and, accordingly, gate electrodes 4a/4b are patterned from a conductive layer (not shown) such as a polysilicon layer, and lightly doped n-type regions 3aa, 3ba and 3ca are formed in the active area in a self-aligned manner with the gate electrodes 4a/4b.

The first inter-level insulating layer 6a and the contact holes 6b to 6d are formed without a mask alignment. The polysilicon word lines WL may be oxidized so as to form the first inter-level insulating layer 6a of 0.2 to 0.4 micron thick. Alternatively, a chemical vapor deposition may be available for the first inter-level insulating layer 6a. The first inter-level insulating layer 6a defines the contact holes 6b to 6d in a self-aligned manner, and is conducive to the reduction of the active area. Although the oxide is grown on the lightly doped n-type regions 3aa to 3ca during the formation of the first inter-level insulating layer 6a, the Japanese Patent Publication of Unexamined Application is silent to the removal of the oxide over the lightly doped n-type regions 3aa to 3ca.

The lightly doped n-type regions 3*aa*, 3*ba* and 3*ca* are partially exposed to the contact holes 6*b* to 6*d*, and exposed areas of the lightly doped n-type regions 3*aa* to 3*ca* are covered with thin oxide layers (not shown) of 10 to 20 nanometers thick. N-type dopant impurity is ion implanted into the exposed areas, and heavily doped n-type regions 3*ab*, 3*bb* and 3*cb* are formed in the lightly doped n-type regions 3*aa*, 3*ba* and 3*ca*, respectively. The lightly doped n-type regions 3aa to 3*ca* and the heavily doped n-type regions 3*ab* to 3*cb* form the n-type source regions 3*a*/3*b* and the n-type common drain region 3*c*.

The thin oxide layer is removed from the n-type common drain region 3*c* exposed to the contact hole 6*d*, and polysilicon is grown over the first inter-level insulating layer 6*a* by using a chemical vapor deposition. The polysilicon layer is etched back so as to form the smooth top surface. The polysilicon is patterned into the conductive pad 13. The first inter-level insulating layer 6*a* electrically isolates the gate electrodes 5*a* and 5*b* from the conductive pad 13, and a short-circuit never takes place between the gate electrodes 5*a*/5*b* and the conductive pad 13, because the growth of the first inter-level insulating layer 6*a* defines the contact hole 6*d*.

The storage node electrodes 7*a*/7*b*, the dielectric layers 8*a*/8*b* and the cell plate electrodes 9*a*/9*b* are successively laminated over the n-type source regions 3*a* and 3*b*, and fabricate the stacked storage capacitors M3 and M4 over the n-channel enhancement type switching transistors SW1/SW2.

Phosphosilicate glass is deposited over the entire surface, and forms the second inter-level insulating layer 10*a*. The contact hole 10*b* is formed in the second inter-level insulating layer 10*a* by using the lithographic techniques, and the smooth top surface is exposed to the contact hole 10*b*. The top smooth surface is wide enough to give a large nesting tolerance to the contact hole 10*b*, and the bit line BL is held in contact through the contact hole 10*b* with the top smooth surface.

Thus, the self-aligned contact hole 6*d* is formed in the first inter-level insulating layer 6*a* without a nesting tolerance, and makes the active area shown in FIG. 2 narrower than the active area shown in FIG. 1.

However, when the prior art dynamic random access memory device shown in FIG. 2 is further scaled down, large resistance impedes a signal propagation between the stacked storage capacitor CP1/CP2 and the bit line BL. This is because of the fact that the signal is propagated against the contact resistance between the n-type common drain region 3*c* and the conductive pad 13, the resistance of the conductive pad 13 and the contact resistance between the conductive pad 13 and the bit line BL. This is the first problem encountered in the prior art dynamic random access memory device shown in FIG. 2.

The second problem is the complicated fabrication process. The step of forming the conductive pad 13 is inserted between the formation of the first inter-level insulating layer 6*a* and the fabrication of the stacked storage capacitors CP1/CP2, and is, accordingly, additional. The complicated process decreases the production yield, and, accordingly, increases the production cost of the semiconductor dynamic random access memory device.

SUMMARY OF THE INVENTION

It is therefore an important object of the present invention to provide a semiconductor memory device which is small in contact resistance between an impurity region and a bit line without sacrifice of the occupation area.

It is also an important object of the present invention to provide a simple process of fabricating the semiconductor memory device.

To accomplish the object, the present invention proposes to form a bit line extending on an insulating layer wrapping a gate electrode and held in contact through a gap between the insulating layer and an insulating layer wrapping an adjacent gate electrode.

In accordance with one aspect of the present invention, there is provided a semiconductor memory device fabricated on a semiconductor substrate, comprising: an memory cell array including a plurality of memory cells each having a switching transistor and a storage capacitor electrically connected in series, the switching transistor having a source region formed in a first surface portion of the semiconductor substrate and electrically connected to the storage capacitor, a drain region formed in a second surface portion of the semiconductor substrate and spaced from the source region, a first gate insulating layer formed on a third surface portion of the semiconductor substrate between the source region and the drain region and a first gate structure formed on the first gate insulating layer and forming a part of a word line; a plurality of insulating wall structures each wrapping the gate structure together with the gate insulating layer, and defining contact windows each exposing the drain region; a plurality of bit lines each held in contact through one of the contact windows with the drain region; and a first inter-level insulating layer covering the insulating wall structures and the bit lines.

In accordance with another aspect of the present invention, there is provided a process of fabricating a semiconductor device, comprising the steps of: a) forming at least one first active area on a surface of a semiconductor substrate; b) forming first gate insulating layers on the first active area; c) forming a first conductive layer over the first gate insulating layer; d) forming a first insulating layer over the first conductive layer; e) patterning the first insulating layer and the first conductive layer into upper insulating walls and first gate structures overlain by the upper insulating walls, formed on the first gate insulating layers and spaced from each other; f) introducing a first dopant impurity into the first active area so as to form a source region and a common drain region in a self-aligned manner with the first gate structures; g) forming side insulating walls on both side surfaces of the first gate structures so as to respectively encapsulate the first gate structures in first insulating wall structures constituted by the upper insulating walls and the side insulating walls, the side insulating walls defining a contact window exposing the common drain region; h) forming a second conductive layer over the insulating wall structures so as to be held in contact through the conductive window with the common drain region; i) patterning the second conductive layer into a bit line; j) covering the bit line with a first inter-level insulating layer; k) fabricating a stacked storage capacitor on the first inter-level insulating layer, and having a storage node electrode held in contact through a contact hole formed in the first inter-level insulating layer with the common drain region; and l) covering the stacked storage capacitor with a second inter-level insulating layer.

BRIEF DESCRIPTION OF THE DRAWINGS

The features and advantages of the semiconductor dynamic random access memory device and the fabrication process according to the present invention will be more clearly understood from the following description taken in conjunction with the accompanying drawings in which:

FIGS. 6A to 6E are cross sectional views taken along line V—V of FIGS. 5A to 5E; and FIGS. 7A to 7E are cross sectional views taken along line VI—VI of FIGS. 5A to 5E.

DESCRIPTION OF THE PREFERRED EMBODIMENT

Figure 3:
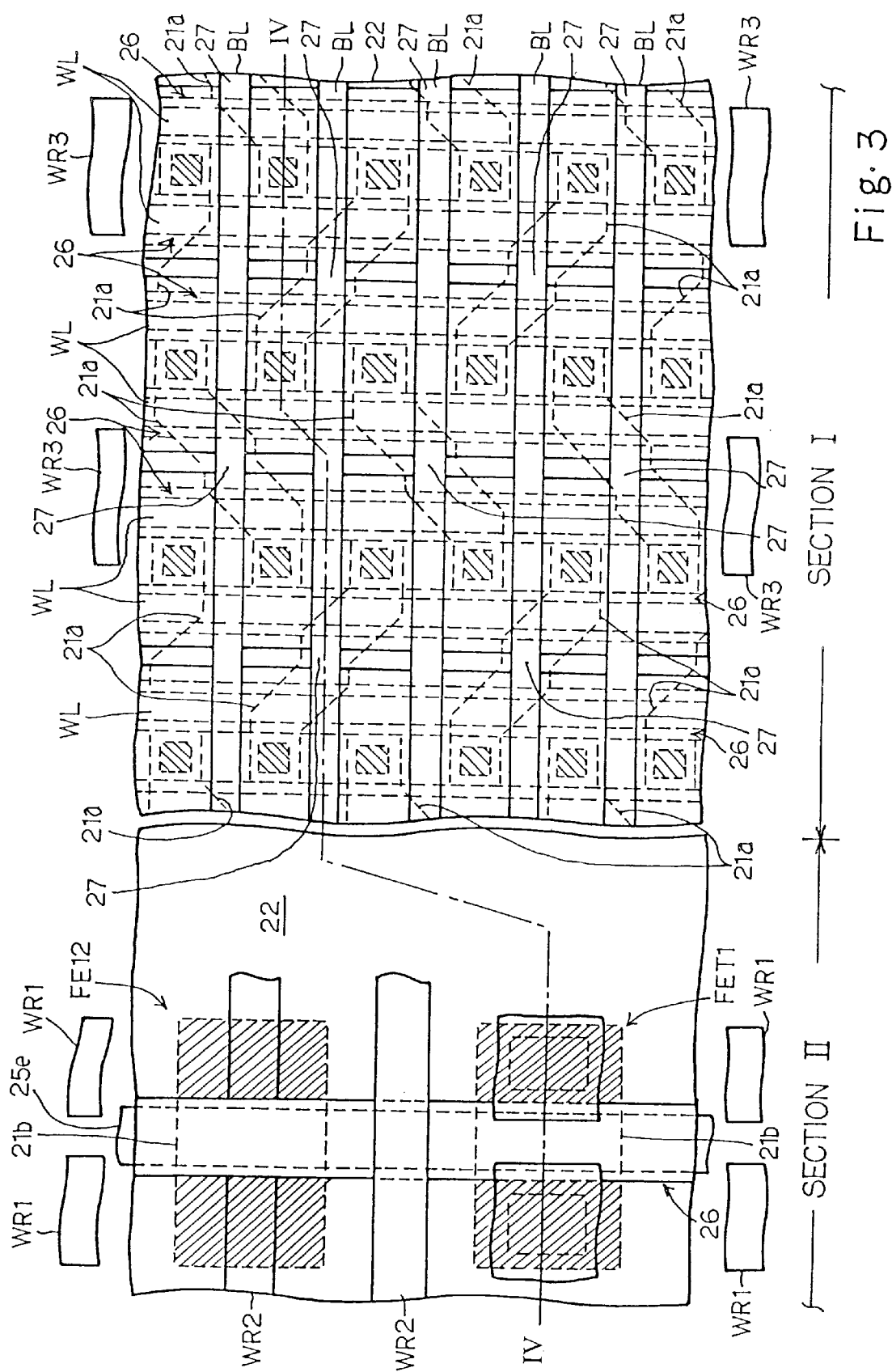
FIG. 3 is a plan view showing the layout of component elements of a semiconductor dynamic random access memory device according to the present invention.
Figure 4:
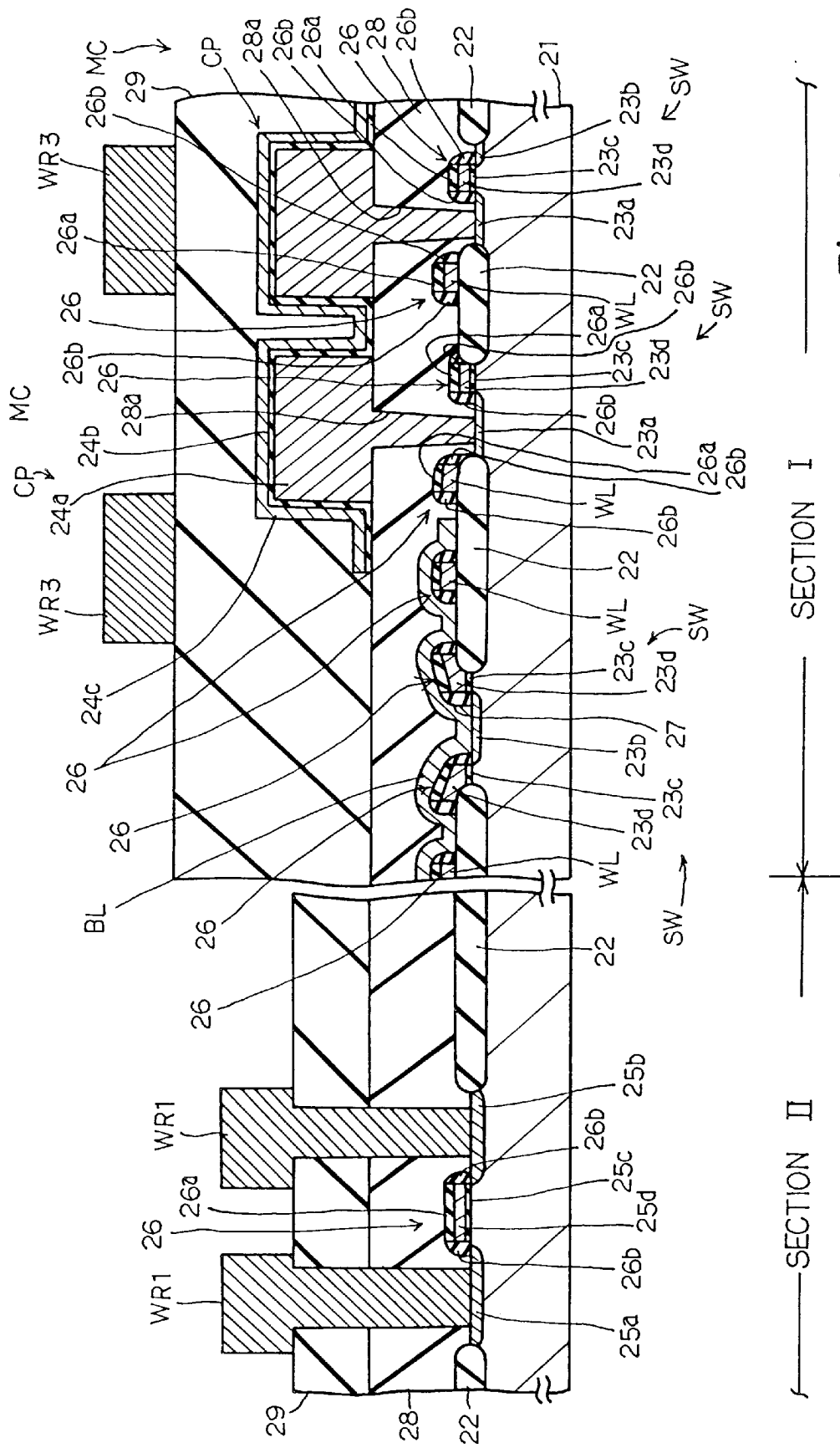
FIG. 4 is a cross sectional view taken along line IV—IV of FIG. 3 and showing the structure of the semiconductor dynamic random access memory device.

Referring first to FIGS. 3 and 4 of the drawings, a semiconductor dynamic random access memory device embodying the present invention is fabricated on a p-type silicon substrate 21. The major surface of the p-type silicon substrate 21 is imaginarily divided into section I and section II, and a field oxide layer 22 defines narrow active areas-21a and wide active areas 21b in these sections. The active areas 21a are parallelogram, and obliquely extend.

The semiconductor dynamic random access memory device comprises a memory cell array and peripheral circuits. The memory cell array is assigned to section I, and peripheral circuits are assigned to section II. The memory cell array stores data bits, and the peripheral circuits write data bits into and read out the data bits from the memory cell array.

A plurality of memory cells MC form the memory cell array, andia pair of memory cells MC is assigned to each narrow active area 21a. An n-channel enhancement type switching transistor SW is connected in series to a stacked storage capacitor CP, and the n-channel enhancement type switching transistor SW and the stacked storage capacitor CP as a whole constitute each of the memory cells MC.

Various circuit components, such as field effect transistors FET1 and FET2 fabricated on the wide active areas 21b, form the peripheral circuits.

The n-channel enhancement type switching transistor SW includes an n-type source region 23a, an n-type common drain region 23b spaced from the n-type source region 23a, a gate insulating layer 23c grown on the active area between the n-type source region 23a and the n-type common drain region 23b and a gate structure 23d. The gate electrode 23d is a part of a word line WL, and the word line WL extending in parallel to one another (see FIG. 3). The word lines WL are connected to one of the peripheral circuits known as a row address decoder/word line driver unit, and the row address decoder/word line driver unit selectively changes the word lines WL to an active high level.

The n-type common drain region 23b is shared between the memory cells MC assigned to the same narrow active area 21a, and bit lines BL extend in parallel to one another. In this instance, the bit lines BL are formed of WSix where x is about 2. The bit line BL is held in contact with the n-type common drain region 23b, and the bit lines BL are connected to one of the peripheral circuits known as a sense amplifier circuit. Adjacent two bit lines BL form a bit line pair, and the sense amplifier circuit increases a potential difference on the bit line pair.

The n-type source region 23a is electrically connected to the stacked storage capacitor CP, and the storage capacitor CP includes a storage node electrode 24a, a dielectric layer 24b covering the storage node electrode 24a and a cell plate electrode 24c opposed through the dielectric layer 24 to the storage node electrode 24a. The storage node electrode 24a accumulates electric charge supplied from the bit line BL through the associated n-channel enhancement type switching transistor SW, and the accumulated electric change generates the potential difference on the associated bit line pair.

The n-type dopant impurity is lightly doped into the n-type source/common drain regions 23a/23b, and only small amount of leakage current flows across the p-n junctions under a reverse biasing condition.

The field effect transistor FET1 includes n-type source/drain regions 25a and 25b spaced apart from each other by a channel region, a gate insulating layer 25c grown on the channel region and a gate electrode 25d formed on the gate insulating layer 25c. The n-type source/drain regions 25a/25b have an LDD (Lightly Doped Drain) structure, and the LDD structure is effective against hot carriers. The gate electrode 25d forms a part of control line 25e. Metal wirings WR1 are held in contact with the n-type source/drain regions 25a/25b, and another metal wiring WR2 is provided for the field effect transistors FET1/FET2. These metal wirings WR1/WR2 cause the field effect transistors FET1 and FET2 to cooperate with other circuit components. The metal wirings WR1 may be formed of aluminum or aluminum alloy, and the metal wirings WR1 is formed from a tungsten silicide layer (not shown) together with the bit lines BL.

The field effect transistor FET2 is similar in arrangement to the field effect transistor FET1, and these field effect transistors FET1 and FET2 are expected to drive a large amount of current.

The semiconductor dynamic random access memory device further comprises a plurality of insulating wall structures 26, and the word lines WL and the control line 25e are encapsulated in the insulating wall structures 26, respectively. The insulating wall structure 26 has an upper insulating wall 26a covering an upper surface of the word line WL and side insulating walls 26b, and the upper insulating wall 26a and the side insulating walls 26b extend along the word line WL and the control line 25e.

Figure 1:
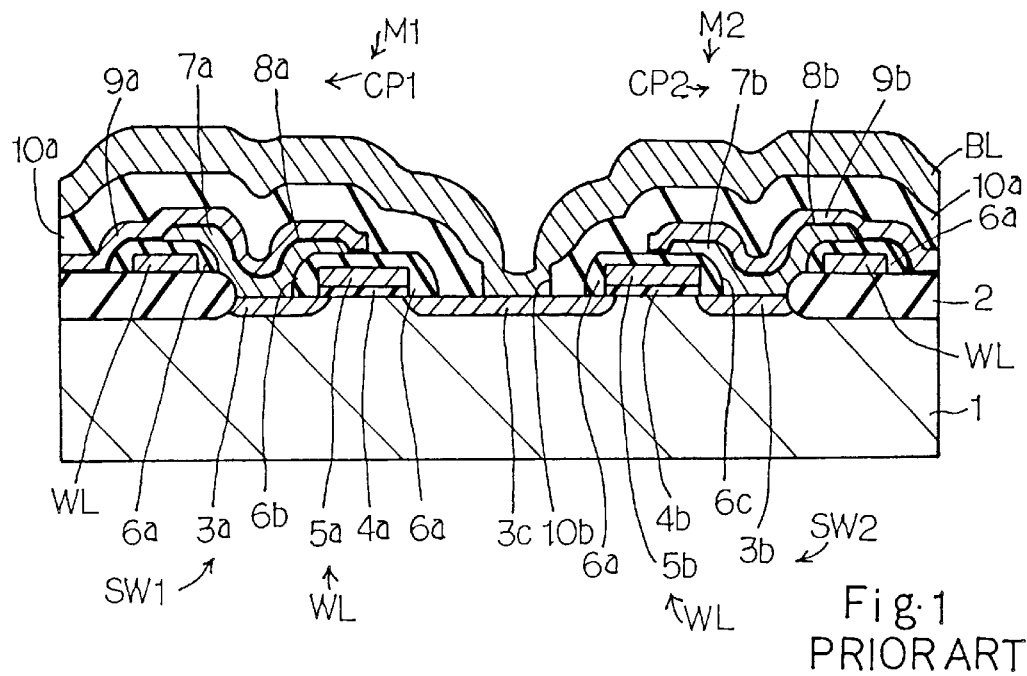
FIG. 1 is a cross sectional view showing the structure of the first prior art semiconductor dynamic random access memory device.

The insulating wall structures 26 are spaced apart from one another and form contact windows 27 therebetween. The bit lines BL extend on the insulating wall structure 26 and the field oxide layer 22, and are held in contact through the contact windows 27 with the n-type common drain regions 23b. When the word lines WL and the control lines 25e are encapsulated in the insulating wall structures 26, the contact windows 27 take place therebetween. In other words, the contact windows 27 are not formed by using lithographic techniques, and do not require a nesting tolerance. For this reason, the active areas 21a are narrower than the active area of the prior art semiconductor dynamic random access memory device shown in FIG. 1.

Figure 2:
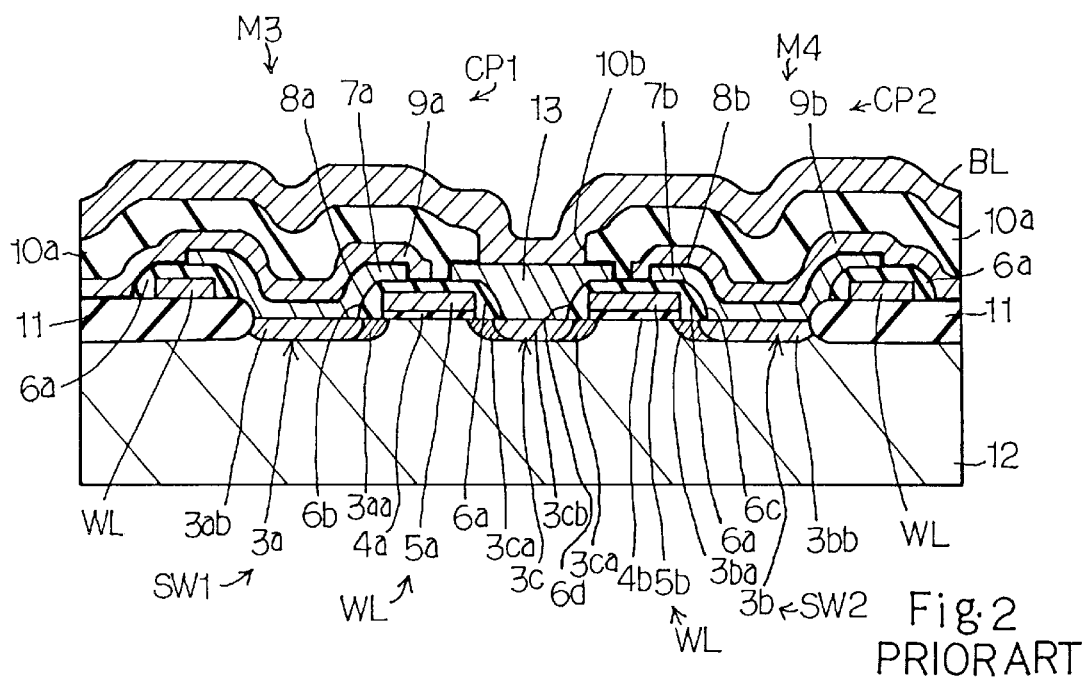
FIG. 2 is a cross sectional view showing the structure of the second prior art semiconductor dynamic random access memory device.

Moreover, the bit lines BL are directly held in contact with the n-type common drain regions 23b, and the contact resistance is decreased rather than that of the prior art semiconductor dynamic random access memory device shown in FIG. 2.

The insulating wall structures 26 and the bit lines BL are covered with a first inter-level insulating layer 28, and node contact holes 28a are formed in the first inter-level insulating layer 28. The node contact holes 28a expose the n-type source regions 23a, and the storage node electrodes 24a pass through the node contact holes 28a so as to reach the n-type source regions 23a. Although the first-inter-level insulating layer 28 is removed from the structure shown in FIG. 3 so as to expose the bit lines, the positions of the node contact holes 28a are latched for the sake of clear discrimination.

The stacked storage capacitors CP are formed on the first inter-level insulating layer 28, and are covered with a second inter-level insulating layer 29. The second inter-level insulating layer 29 is different in thickness between the section I and the section II, and the metal wirings WR1 and other aluminum wirings WR3 extend on the second inter-level insulating layer 29. The second inter-level insulating layer 29 and the metal wirings WR1/WR3 are also removed from the structure shown in FIG. 3. However, rectangular marks represent the positions of the metal wirings WR1/WR3, and are labeled with the same references WR1/WR3. Contact holes are formed in the first and second inter-level insulating layers 28/29, and the metal wirings WR1 are held through the contact holes with the impurity regions 25a and 25b.

The semiconductor dynamic random access memory device is fabricated as follows. FIGS. 5A to 5E, FIGS. 6A to 6E and FIGS. 7A to 7E illustrate a process sequence for fabricating the semiconductor dynamic random access memory device.

Figure 5A:
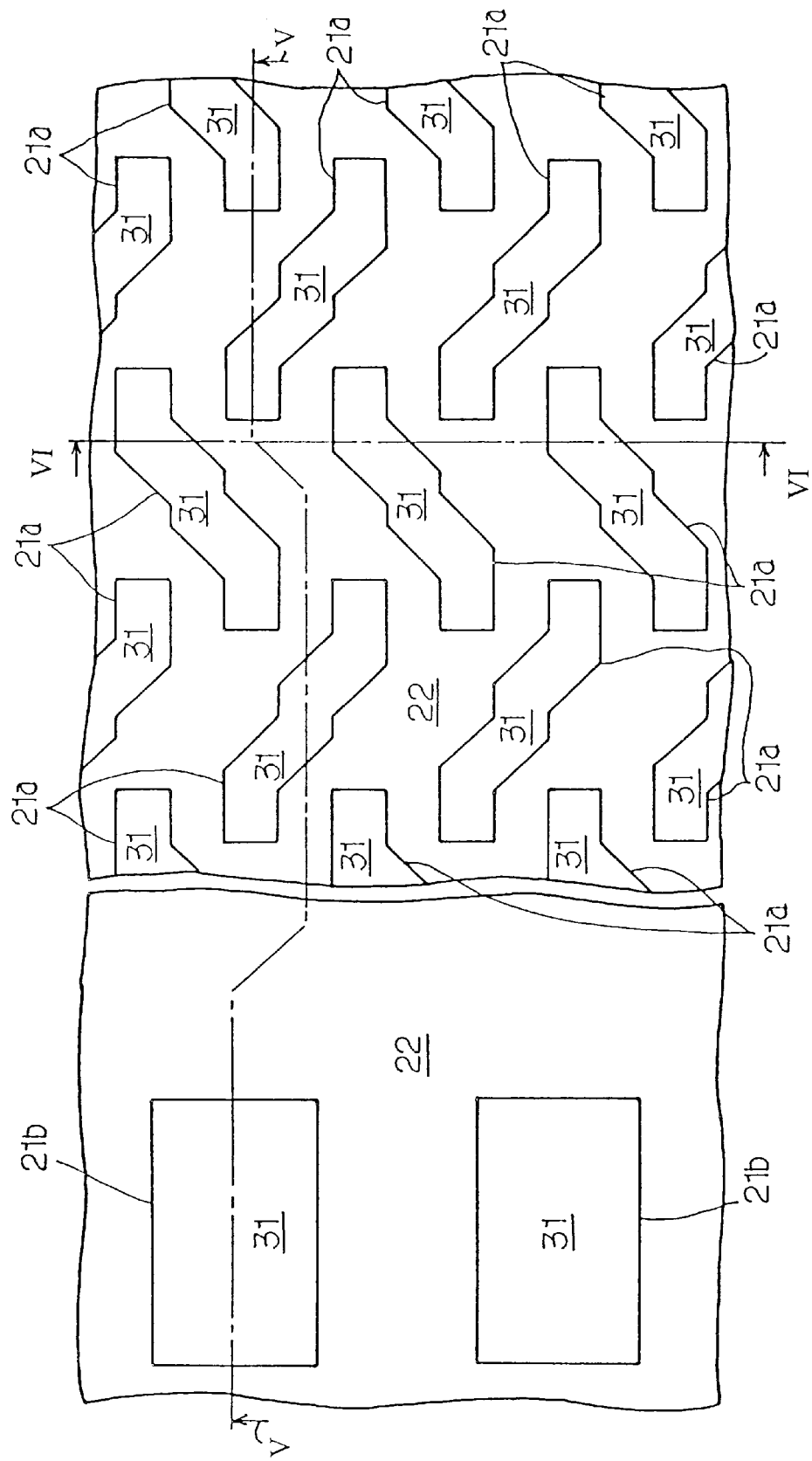
FIGS. 5A to 5E are plan views showing a process sequence of fabricating the semiconductor dynamic random access memory device.

The process sequence starts with preparation of the p-type silicon substrate 21, and the field oxide layer 22 is selectively grown on sections I and II of the p-type silicon substrate 21. The field oxide layer 22 defines the narrow active areas 21a in section I and the wide active areas 21b in section II. The p-type silicon substrate 21 is placed in oxidizing ambience, and thin silicon oxide layers 31 are thermally grown on the narrow active areas 21a and the wide active areas 21b as shown in FIGS. 5A, 6A and 7A.

Subsequently, polysilicon is deposited over the entire surface of the resultant structure shown in FIGS. 5A, 6A and 7A. A refractory metal silicide may be further deposited over the polysilicon layer. Silicon oxide is deposited to 100 nanometers thick over the polysilicon layer or the lamination of the polysilicon layer and the refractory metal silicide layer, and the polysilicon layer or the lamination is overlain by a silicon oxide layer.

A photo-resist etching mask (not shown) is formed on the silicon oxide layer by using lithographic techniques, and the silicon oxide layer, the polysilicon layer/the lamination and the silicon oxide layer 31 are respectively patterned to the upper insulating walls 26a, the word lines/control line WL/25e and the gate insulating layers 23c/25c.

Figure 5B:
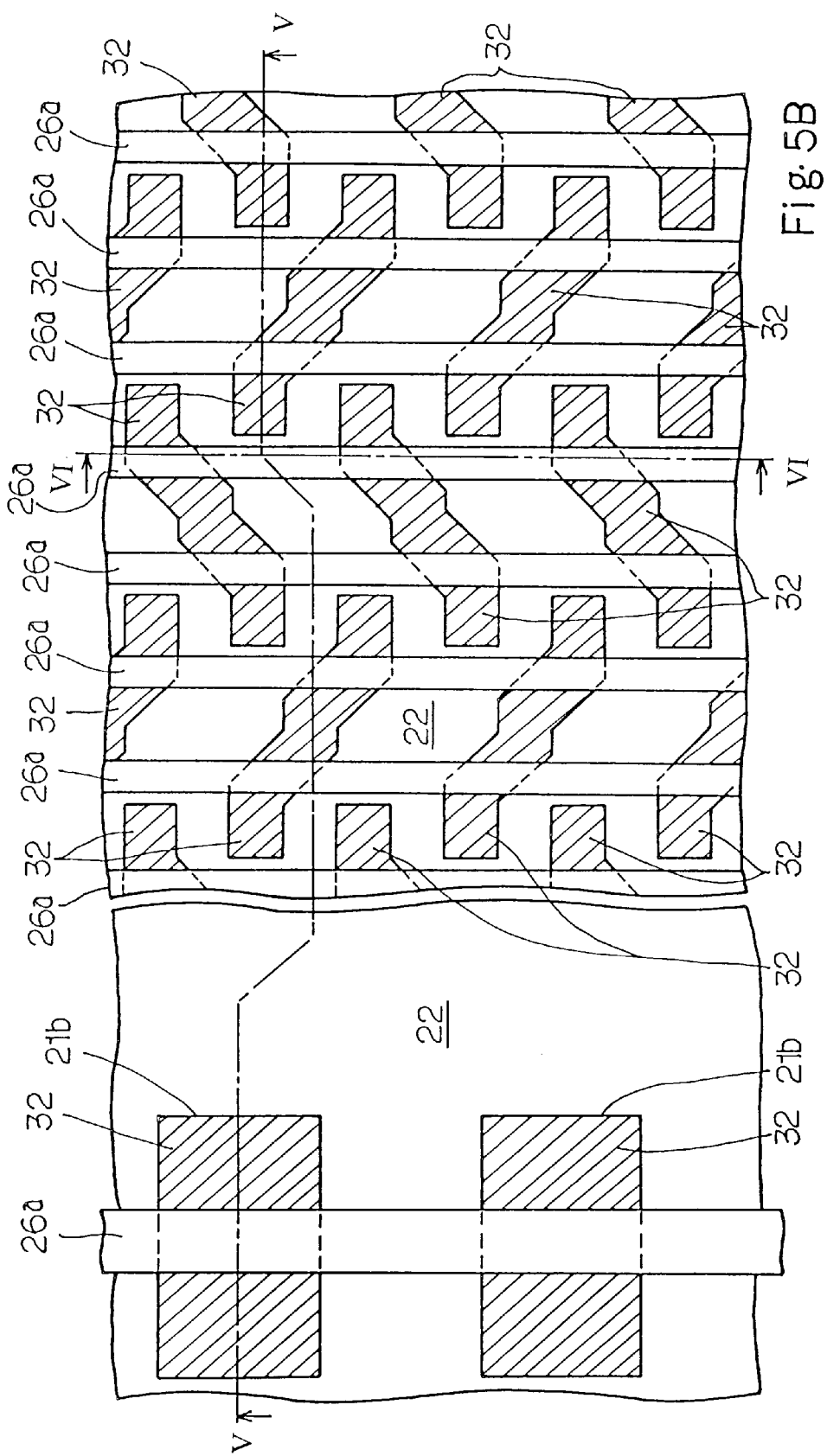
Figure 6B:
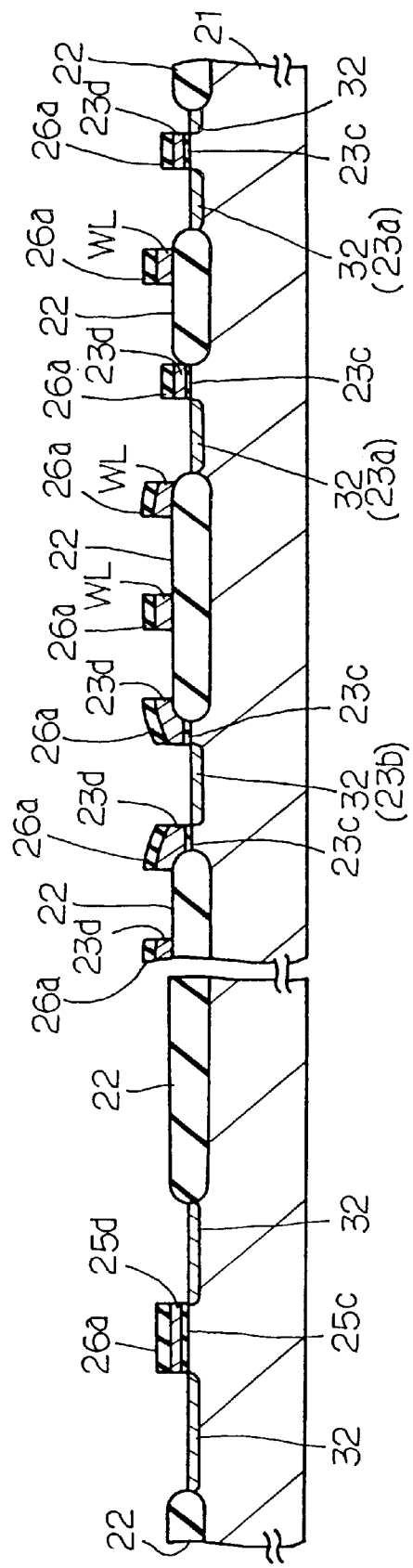
Figure 7B:
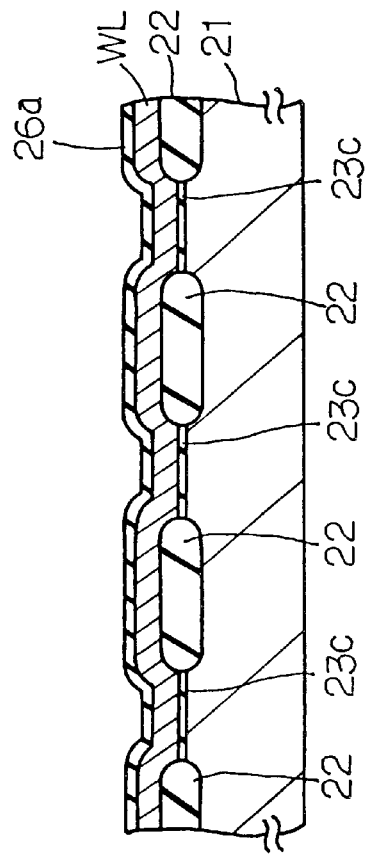

The p-type silicon exposed to the active areas 21a/21b are thermally oxidized, and the narrow active areas 21a and the wide active areas 21b are covered with thin silicon oxide layers (not shown). N-type dopant impurity is ion implanted into the narrow active areas 21a and the wide active areas 21b, and lightly doped n-type impurity regions 32 are formed in the narrow active areas 21a and the wide active areas 21b as shown in FIGS. 5B, 6B and 7B. The n-type impurity regions 32 in the narrow active areas 21a serve as the n-type source regions 23a and the n-type common drain regions 23b. The n-type impurity regions 32 are hatched in FIG. 5B for clear discrimination.

Subsequently, silicon oxide is deposited over the entire surface of the structure shown in FIGS. 5B, 6B and 7B so as to form a silicon oxide layer, and the silicon oxide layer is anisotropically etched without an etching mask. As a result, the side insulating walls 26b are left on the side surfaces of the word lines/the control line WL/25e. The silicon oxide layers on the lightly doped n-type regions 32 are removed during the anisotropic etching.

The upper insulating walls 26a and the side insulating walls 26b form in combination the insulating wall structures 26, and the word line WL and the control line 25e are encapsulated in the insulating wall structures 26. Thus, a mask alignment step is not incorporated in the fabrication of the insulating wall structures 26, and the manufacturer does not take a nesting tolerance into account.

Figure 5C:
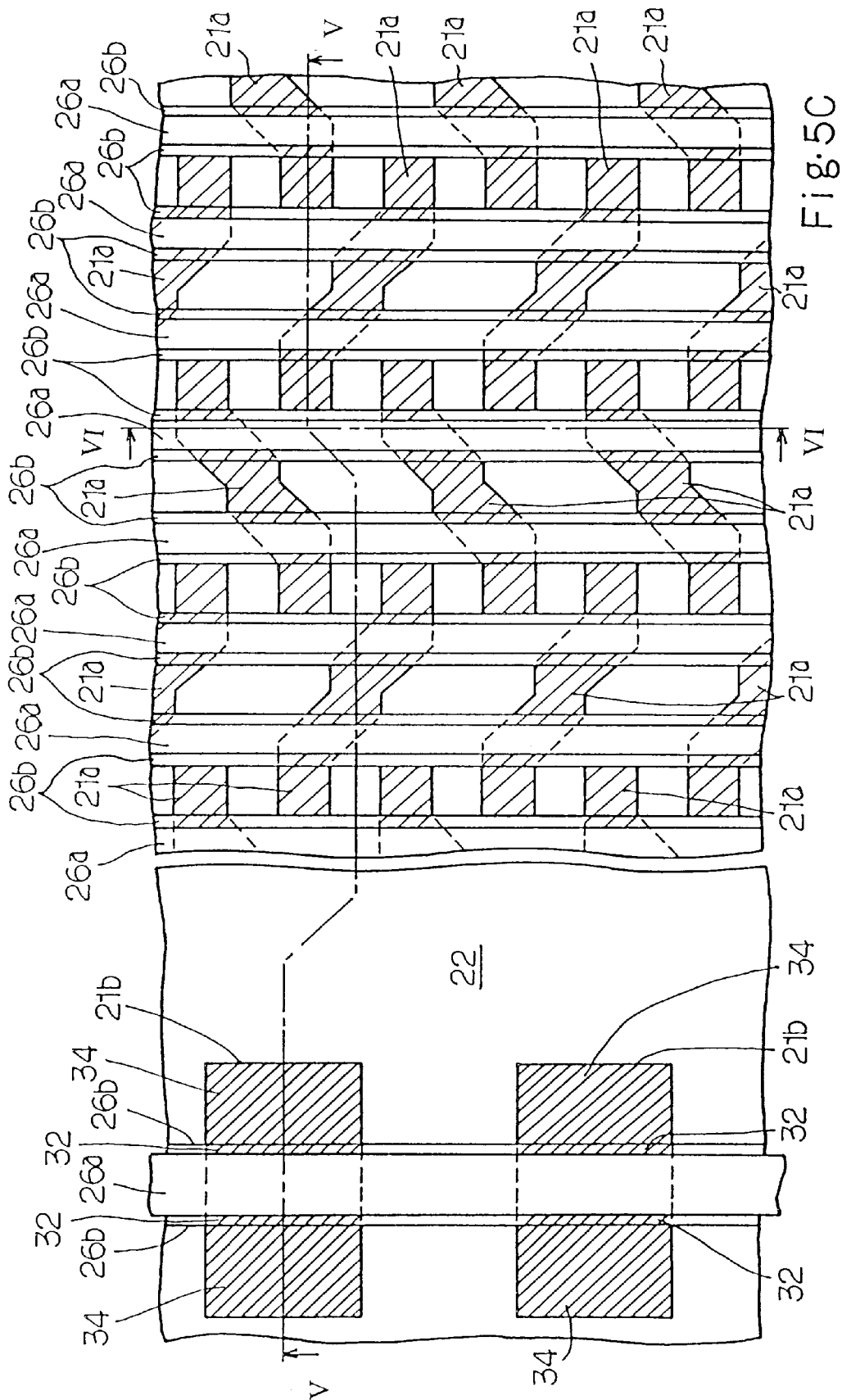
Figure 6C:
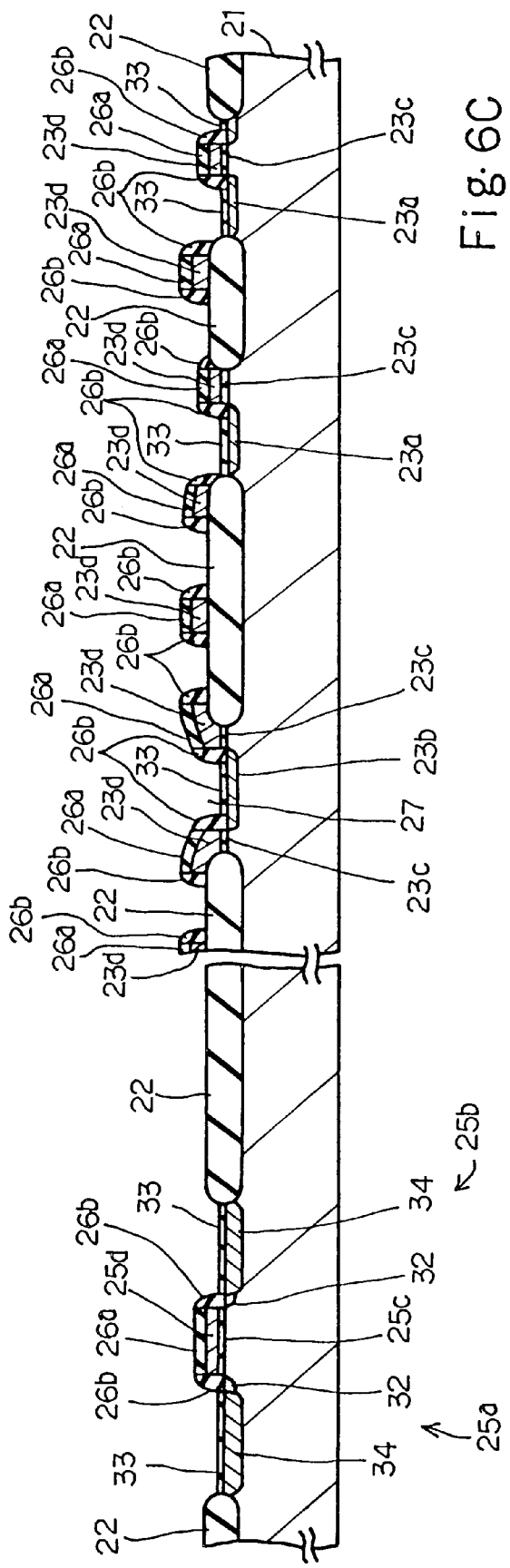
Figure 7C:
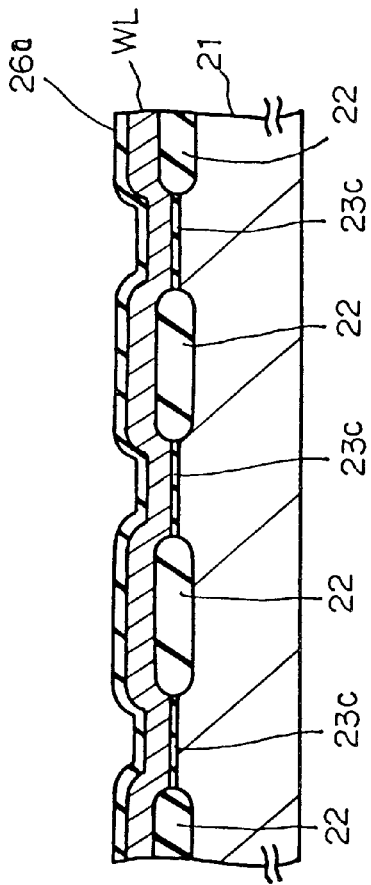

Subsequently, thin silicon oxide layer 33 is thermally grown to 20 nanometers thick on the lightly doped n-type regions 32, and a photo-resist mask (not shown) is formed over the section I. N-type dopant impurity is ion implanted into the wide active areas 21b, and forms heavily doped n-type regions 34. The heavily doped n-type regions 34 are hatched at small intervals in FIG. 5. The lightly doped n-type regions 32 and the heavily doped n-type regions 34 form in combination the LDD structure for the field effect transistors FET1/FET2. However, the photo-resist mask prevents the narrow active areas 21a from the ion implantation, and the n-type source regions 23a and the n-type common drain regions 23b remain lightly doped. After the ion implantation, the photo-resist mask is stripped off, and the resultant structure is illustrated in FIGS. 5C, 6C and 7C.

Subsequently, the silicon oxide layers 33 are etched away from the n-type source region 23a and the n-type common drain region 23b. However, a photo-resist mask (not shown) prevents the silicon oxide layer 33 on the wide active area 21b not held in contact with the metal wiring WR2 from the etchant. Although the photo-resist mask is patterned on the wide active area 21b, the area for the nesting tolerance is ignoreable.

The etchant exposes the n-type source regions 23a and the n-type common drain regions 23b to the contact windows 27, and a mis-alignment of the photo-resist mask (not shown) on the wide active areas 21b does not affect the n-type source region 23a and the n-type common drain region 23b.

Figure 5D:
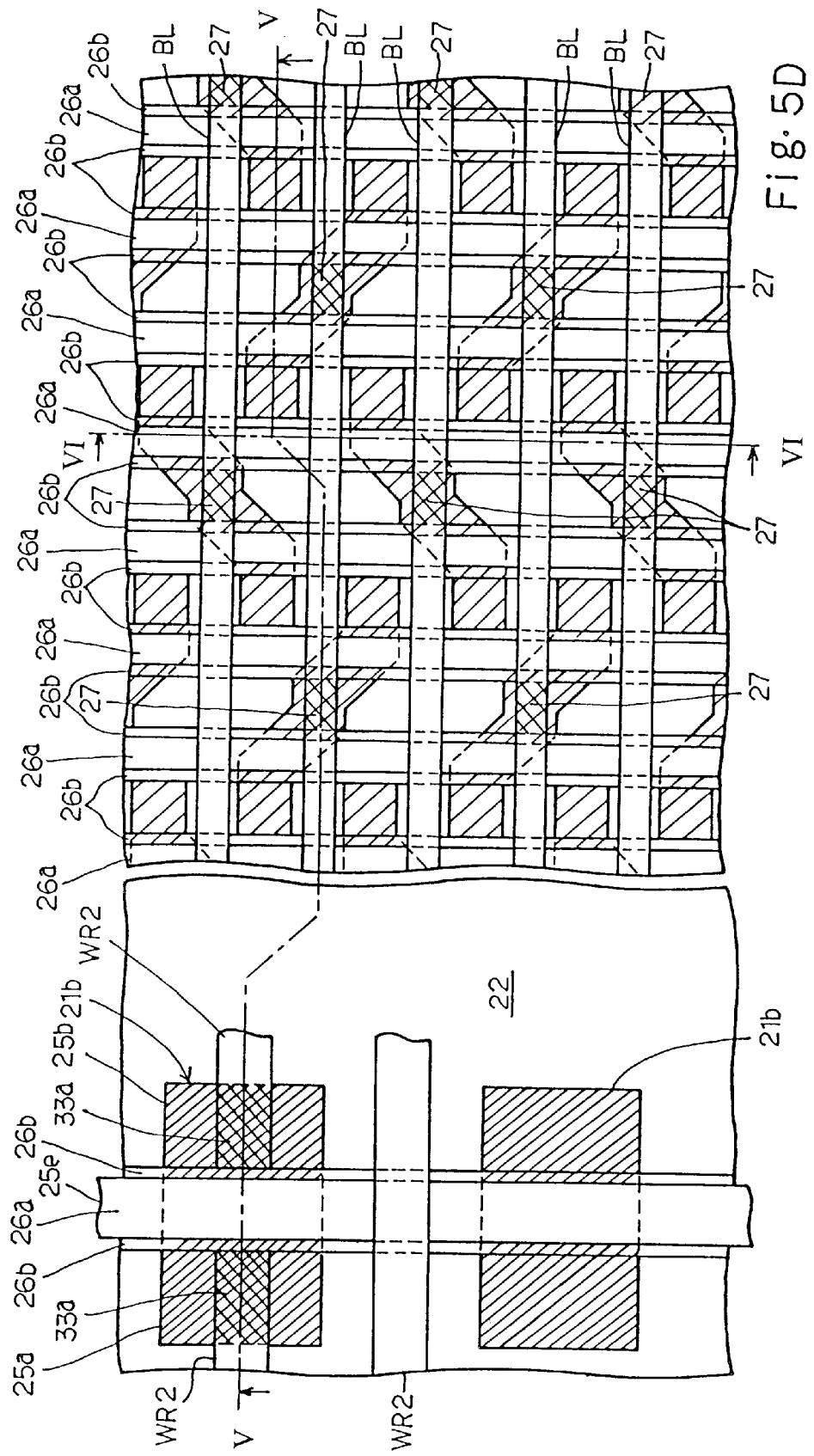
Figure 6D:
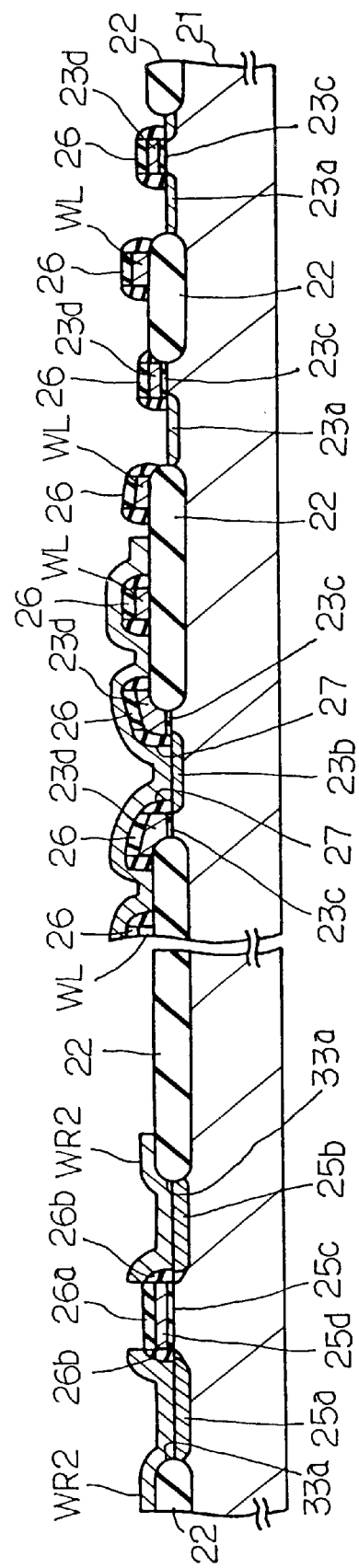
Figure 7D:
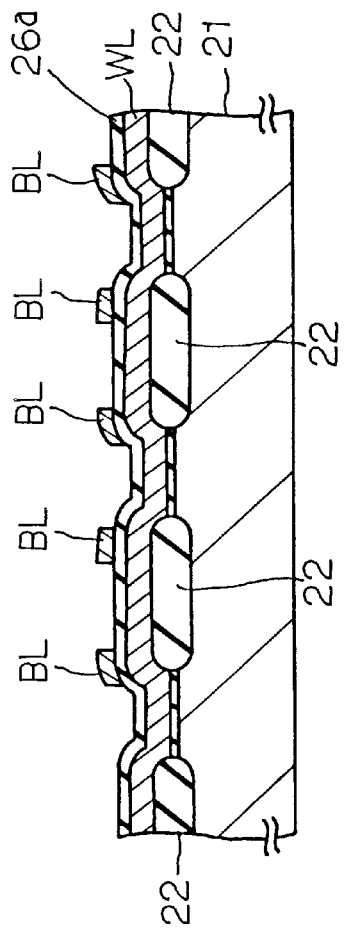

Subsequently tungsten silicide WSix is deposited to 100 nanometers thick over the entire surface, and the tungsten silicide layer is patterned to the bit lines BL and the metal lines WR2 as shown in FIGS. 5D, 6D and 7D. Gaseous etchant containing $Cl_2$ is available for the etching step for the tungsten silicide layer. The gaseous etchant does not etch the silicon oxide and the silicon, and forms the bit lines BL and the metal lines WR2. The silicon oxide layer 33 still covers the wide active areas 21b except for the contact holes 33a, and prevents the n-type source/drain regions 25a/25b from the gaseous etchant.

The bit lines BL are held in contact through the contact windows 27 to the n-type common drain regions 23b, and the positions of the contact windows 27 are netted in FIG. 5D. The metal line WR2 is held in contact through the contact holes with the n-type source and drain regions 25a/25b, and the contact holes are also netted in FIG. 5D.

The insulating wall structures 26 electrically isolates the word lines WL from the bit lines BL, and the bit lines BL form wide contacts with the n-type common drain regions 23b in a self-aligned manner. Thus, the bit lines BL are directly held in contact with the n-type common drain regions 23b, and the contact resistance is surely decreased.

Figure 5E:
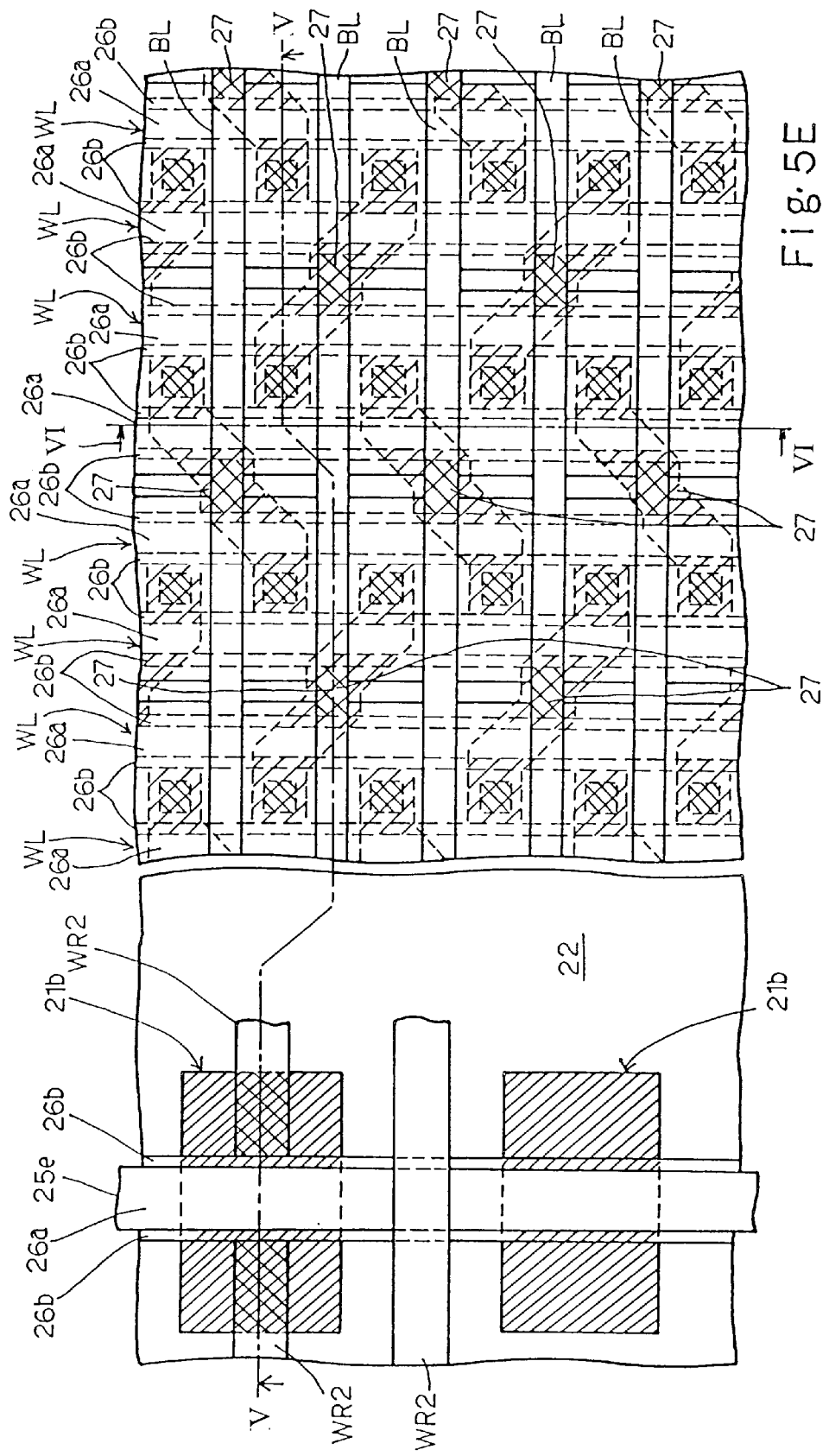

The first inter-level insulating layer 26, and a photo-resist etching mask (not shown) is formed on the first inter-level insulating layer 26. The photo-resist mask (not shown) exposes upper areas of the first inter-level insulating layer 28 over the n-type source regions 23a to an etchant, and the contact holes 28a are formed in the first inter-level insulating layer 28. Polysilicon is deposited over the entire surface of the first inter-level insulating layer 28, and fills the contact holes 28a. A photo-resist etching mask (not shown) is formed on the polysilicon layer, and covers the area over the n-type source regions 23a. Using the photo-resist etching mask, the polysilicon layer is selectively etched away, and is patterned to the storage node electrodes 24a as shown in FIGS. 5E, 6E and 7E.

Subsequently, the storage node electrodes 24a is covered with insulating material, and the insulating material is further covered with a conductive material. A photo-resist etching mask (not shown) is formed on the conductive material layer, and the conductive material layer and the insulating material layer are patterned to the dielectric layer 24b and the cell plate electrodes 24c. The dielectric layer may be formed from a silicon film and/or a silicon nitride film.

The second inter-level insulating layer 29 is deposited over the entire surface of the structure, and aluminum alloy is sputtered on the second inter-level insulating layer 29. A photo-resist etching mask (not shown) is formed on the aluminum alloy layer, and the aluminum alloy layer is patterned to the metal wirings WR1 and WR3 as shown in FIGS. 3 and 4.

As will be appreciated from the foregoing description, the insulating wall structures 26 form the contact windows 27 without a photo-resist mask, and the insulating wall structures 26 are necessary for the LDD structure of the field effect transistors FET1/FET2 of the peripheral circuits. Therefore, the process sequence according to the present invention is highly compatible to the prior art process, and the direct contact between the bit lines BL and the n-type common drain regions 23b decreases the contact resistance.

Although particular embodiments of the present invention have been shown and described, it will be obvious to those skilled in the art that various changes and modifications may be made without departing from the spirit and scope of the present invention.

For example, the insulating wall structure may be formed from silicon nitride layers or other insulating layers. The gate structure may have a salicide structure, and the refractory metal silicide is not limited to the tungsten silicide.

Moreover, the semiconductor dynamic random access memory device according to the present invention may form an ultra large scale integration together with other function blocks.

What is claimed is:

1. A process of fabricating a semiconductor device, comprising the steps of:
   a) forming at least one first active area on a surface of a semiconductor substrate;
   b) forming first gate insulating layers on said first active area;
   c) forming a first conductive layer over said first gate insulating layers;
   d) forming a first insulating layer over said first conductive layer;
   e) patterning said first insulating layer and said first conductive layer into upper insulating walls and first gate structures overlain by said upper insulating walls, formed on said first gate insulating layers and spaced from each other;
   f) introducing a first dopant impurity into said first active area so as to form a source region and a common drain region in a self-aligned manner with said first gate structures;
   g) forming side insulating walls on both side surfaces of said first gate structures so as to respectively encapsulate said first gate structures in first insulating wall structures constituted by said upper insulating walls and said side insulating walls, said side insulating walls defining a contact window exposing said common drain region;
   h) forming a second conductive layer over said insulating wall structures so as to be held in contact through said contact window with said common drain region;
   i) patterning said second conductive layer into a bit line;
   j) covering said bit line with a first inter-level insulating layer;
   k) fabricating a stacked storage capacitor on said first inter-level insulating layer and having a storage node electrode held in contact through a contact hole formed in said first inter-level insulating layer with said source region; and
   l) covering said stacked storage capacitor with a second inter-level insulating layer.

2. The process as set forth in claim 1, in which said first dopant impurity is further introduced into a second active area of said semiconductor substrate so as to form a lightly doped source region and a lightly doped drain region in a self-aligned manner with a second gate structure on a second gate insulating layer in said step f), said process further comprising the step of introducing a second dopant impurity into said second active area in a self-aligned manner with a second insulating wall structure concurrently formed together with said first insulating wall structures between said step g) and said step h).

3. A process of fabricating a semiconductor device, comprising the steps of:

forming a first word line on a semiconductor substrate to extend in a first direction;

forming a second word line on said semiconductor substrate to extend in said first direction;

forming a bit line on said semiconductor substrate to extend in a second direction perpendicular to said first direction;

forming an active region in said semiconductor substrate to extend diagonally to said first and second directions, said first and second word lines and said bit line running over said active region, said active region having a first end portion located on one side of said bit line, and a second end portion located on another side of said bit line;

forming a diffusion region in said active region between said first and second word lines, said diffusion region being coupled to said bit line;

forming a first capacitor in said first end portion of said active region;

forming a second capacitor in said second end portion of said active region;

forming a first transistor in said active region between said first capacitor and said diffusion region, said first transistor having a first control gate coupled to said first word line operatively to connect said first capacitor and said diffusion region;

forming a second transistor in said active region between said second capacitor and said diffusion region, said second transistor having a second control gate coupled to said second word line operatively to connect said second capacitor and said diffusion region; and forming a plurality of insulating walls each wrapping said first and second word lines, thereby defining a contact window exposing said diffusion region;

wherein said bit line is formed to extend between said first and second capacitors and on said diffusion region and said insulating walls, and to be in direct contact with said diffusion region through said insulating walls.

4. A process of fabricating a semiconductor device, comprising the steps of:

forming a plurality of word lines each extending in a first direction;

forming a plurality of bit lines each extending in a second direction perpendicular to said first direction;

forming a plurality of active areas each extending diagonally to said first and second directions, each of said active areas overlapping adjacent two word lines of said plurality of word lines and one bit line of said plurality of bit lines, each of said active areas having a first portion, a second portion, and a third portion located between said first and second portions, said first portion being located on one side of said one bit line of said plurality of bit lines such that one word line of said adjacent two word lines is located between said first and third portions, said second portion being located on the other side of said one bit line of said plurality of bit lines such that another word line of said adjacent two word lines is located between said second and third portions, said third portion being located between said two word lines;

forming a first capacitor group on a first line running in said first direction, said first capacitor group having a plurality of first capacitors, each of said first capacitors being located on said first portion of each of said active areas;

forming a second capacitor group on a second line running in said first direction, said second capacitor group having a plurality of second capacitors, each of said second capacitors being located on said second portion of each of said active areas;

forming a plurality of diffusion regions, each of said diffusion regions being located in said third portion of each of said active areas;

forming a plurality of first transistors, each of said first transistors being located in each of said active areas operatively to connect each of said first capacitors and each of said diffusion regions, respectively, each of said first transistors having a first control gate coupled to said one of said adjacent two word lines;

forming a plurality of second transistors, each of said second transistors located in each of said active areas operatively to connect each of said second capacitors and each of said diffusion regions, respectively, each of said second transistors having a second control gate coupled to said another of said adjacent two word lines; and forming a plurality of insulating walls each wrapping said plurality of word lines, thereby defining a contact window exposing each of said diffusion regions;

wherein said active areas are formed such that, active areas, including even numbered capacitors of said first capacitor group, are at an angle with said first direction at one side of said first line defined by said first capacitor group, active areas, including odd numbered capacitors of said first capacitor group, are at said angle with said first direction at another side of said first line defined by said first capacitor group, and said one bit line extends between said first and second capacitors of each of said active areas, extends on said diffusion regions and said insulating walls of each of said active areas, and is in direct contact with said diffusion regions of each of said active areas through said insulating walls, respectively.

5. A process for fabricating a semiconductor memory device having a memory cell array and a peripheral circuit electrically connected to said memory cell array for transferring signals from and to said memory cell array on a semiconductor substrate, characterized by the steps of defining a first active region and a second active region in a memory cell array forming area and a peripheral circuit forming area by selectively forming an isolating region on a surface of said semiconductor substrate, forming a first gate electrode and a second gate electrode respectively extending across said first active region and said second active region by forming a first gate insulating layer and a second gate insulating layer on a surface of said first active region and a surface of said second active region, depositing a first conductive layer and a first insulating layer over the entire surface and patterning said first conductive layer and said first insulating layer, forming a pair of first source and drain regions and a pair of second source and drain regions in said first active region and said second active region through a first ion-implantation by using said first gate electrode, said second gate electrode and said isolating region as a mask, forming a first insulating spacer and a second insulating spacer on the side surfaces of said first gate electrode and the side surfaces of said second gate electrode converted with said first insulating layer, forming an insulating mask layer on said first active region except for an area covered with said first gate electrode and said first insulating spacer and on said second active region except for an area covered with said second gate electrode and said second insulating spacer for protecting said semiconductor substrate against an ion-implantation forming a pair of third source and drain regions connected to said pair of second source and drain regions by using a second ion-implantation through said mask insulating layer over said second active region, removing said insulating mask layer from said first active region, forming a bit line connected to one of said first source and drain regions of said pair by depositing a second conductive layer and patterning said second conductive layer, and forming a lower electrode of a capacitor after deposition of an inter-level insulating layer by forming a through-hole reaching the other of said first source and drain regions of said pair, depositing a third conductive layer and patterning said third conductive layer.

* * * * *

UNITED STATES PATENT AND TRADEMARK OFFICE
CERTIFICATE OF CORRECTION

PATENT NO. : 6,143,600
DATED : November 07, 2000
INVENTOR(S) : Yoshihiro TAKAISHI It is certified that error appears in the above-identified patent and that said Letters Patent is hereby corrected as shown below:

Column 12, line 42, after "layer," insert --thereby defining a contact window exposing one of said first source and drain region;--;

line 58, after "pain" insert --through said contact window defined by said first and second insulating spaces,-- line 60, after "layer" insert --said bit line extending on said first insulating layer, on said first insulating spacer, and on said second insulating spacer--.

Signed and Sealed this

Twenty-ninth Day of May, 2001

Attest:

NICHOLAS P. GODICI

*Attesting Officer*   *Acting Director of the United States Patent and Trademark Office*